(12) United States Patent
Stautner

(10) Patent No.: US 8,238,988 B2
(45) Date of Patent: *Aug. 7, 2012

(54) APPARATUS AND METHOD FOR COOLING A SUPERCONDUCTING MAGNETIC ASSEMBLY

(75) Inventor: Ernst Wolfgang Stautner, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 627 days.

This patent is subject to a terminal disclaimer.

(21) Appl. No.: 12/415,357

(22) Filed: Mar. 31, 2009

(65) Prior Publication Data
US 2010/0248968 A1    Sep. 30, 2010

(51) Int. Cl.
*G01R 33/035* (2006.01)
(52) U.S. Cl. ........... 505/162; 62/47.1; 62/48.1; 62/48.2; 62/48.3; 62/50.1; 62/50.2; 62/51.1; 505/163
(58) Field of Classification Search .................... 62/47.1, 62/48.1, 48.2, 48.3, 50.1, 50.2, 51.1; 505/162, 505/163
See application file for complete search history.

(56) References Cited

U.S. PATENT DOCUMENTS

| | | | |
|---|---|---|---|
| 5,966,944 | A | 10/1999 | Inoue |
| 6,147,579 | A | 11/2000 | Einziger et al. |
| 2005/0252219 | A1 | 11/2005 | VanHasset |
| 2007/0101742 | A1 | 5/2007 | Laskaris et al. |

FOREIGN PATENT DOCUMENTS

| | | |
|---|---|---|
| EP | 0905524 | 12/2004 |
| GB | 2301426 A | 4/1996 |
| GB | 2422654 A | 8/2006 |
| GB | 2426317 A | 11/2006 |
| GB | 2432725 | 5/2007 |
| JP | 200778310 A | 3/2007 |
| JP | 200891802 A | 4/2008 |
| WO | WO2006122594 | 11/2006 |

OTHER PUBLICATIONS

GB1004558.1 Search Report, Sep. 10, 2010.
JP2007078310 Abstract, Sep. 16, 2005.
JP2008091802 Abstract, Oct. 5, 2006.

*Primary Examiner* — Edward Cain
(74) *Attorney, Agent, or Firm* — Joseph J. Christian

(57) ABSTRACT

A superconducting magnet assembly and method of cooling a superconducting magnet assembly. An embodiment of the method of manufacturing a superconducting magnet assembly includes: providing a housing configured about a vacuum reservoir; forming a coil former; surrounding the coil former with a thermal shield; locating the thermal shield in the vacuum reservoir; positioning a superconducting magnet about the coil former, wherein the superconducting magnet is configured about a central core to receive an object; providing a second vacuum reservoir having a cryogen reservoir therein; providing two two-phase heat transfer devices wherein each comprises tubing having an evaporator region and a condenser region; thermally connecting the evaporator region of one of the heat transfer devices with the coil former and/or the superconducting magnet and the evaporator region of the other two-phase heat transfer device with the thermal shield; and thermally connecting a cryocooler to the cryogen reservoir and to the condensing region of both heat transfer devices.

28 Claims, 3 Drawing Sheets

`US 8,238,988 B2`

APPARATUS AND METHOD FOR COOLING A SUPERCONDUCTING MAGNETIC ASSEMBLY

CROSS-REFERENCE TO RELATED APPLICATIONS

This application is related in some aspects to commonly owned U.S. application Ser. No. 12/415,313, entitled "APPARATUS AND METHOD OF SUPERCONDUCTING MAGNET COOLING", filed concurrently herewith, the entire contents of which are herein incorporated by reference.

BACKGROUND OF THE INVENTION

The present invention relates generally to the cooling of superconducting magnets and more particularly to an apparatus and method for cooling a superconducting magnetic assembly such as a magnetic resonance imaging (MRI) assembly.

Various systems employ superconducting magnets to generate a strong, uniform magnetic field within which a subject, or as in the case of an MRI system a patient, is placed. Magnetic gradient coils and radio-frequency transmit and receive coils then influence gyromagnetic materials in the subject to provoke signals that can be used to form useful images. Superconducting magnetic assemblies or systems that use such coils include MRI systems, spectroscopy systems, magnetic energy storage systems, and superconducting generators.

FIG. 1 illustrates a partial cut-away view of a typical MRI system 100 of the related art which may include a superconducting magnet 122 embedded in a coil former 120, a thermal shield 114, gradient coils 108, an RF coil 106, a bucking coil 124, and an RF shield within a housing 102. The housing 102 includes a central bore 104 for the object (e.g., patient) to be placed therein.

The superconducting magnet 122 and bucking coil 124 are typically immersed in a cryostat bath (e.g., helium vessel) 116 containing a cryogen 118 creating a pool-boiling mode or state. The MRI system 100 further includes the thermal shield 114 and a vacuum region 112 created by a vacuum vessel 110 that further insulates the superconducting magnet 122 from the environment during operation. The superconducting magnet 122 also has a coil support structure (e.g., coil former 120) to support a coil winding, embedded within the helium vessel 118 for cooling. The helium vessel 118 is typically a pressure vessel located within the vacuum vessel 112 for thermal isolation and typically contains liquid helium to provide cooling for the superconducting magnet 122 so as to maintain a temperature of around 4.2 Kelvin for superconducting operation.

A significant cost for any system that employs superconducting magnets is for the provision of the cryogen bath. Helium, or a similar cryogen (e.g., neon), is needed both for initial start-up and operation of the superconducting magnet, and for keeping the magnet in a pool-boiling state. While thermodynamically efficient, a full helium bath, when employed in a superconducting magnet assembly, requires a relatively large volume of helium on the order of approximately 1,500 to 2,000 liters. Additionally, during shipping of an MRI system several hundreds of liters (e.g., 600-800 liters) of helium typically boil off from the system. The boiled-off cryogen must be replenished prior to operating the system. Helium is expensive per unit volume, is not always readily obtainable, and its cost is increasing.

A coldhead, or cryocooler, 130 supplies cooling power at cryogenic temperatures. In the case of a dual-stage coldhead, cooling power is provided directly at the cooling stages of the cooler. Typically, most cryocoolers used today in the MRI industry mainly work on the GM cooling principle. In an MRI application a cryocooler typically provides 50 W at 40 degrees Kelvin at the first stage and 1 to 1.5 W at 4 degrees Kelvin at the second stage.

Current coldhead configurations and designs have several drawbacks. Due to its proximity, the cryocooler is subject to a magnetic field imposed on it from the superconducting magnet of the MRI system. In order to prevent ghosting effects that may show up as artifacts during image acquisition, the cryocooler cold stages (specifically the moving piston within the cryocooler) must be magnetically shielded. This has proven to be costly. In addition, the motor drive part(s) of the cryocooler requires thick metallic magnetic shielding to ensure that the cryocooler can work properly without failure. This too is costly. The cryocooler typically is operated in a vertical, near-vertical, or horizontal orientation. While a vertical orientation is preferred due to cryocooler durability issues, this orientation causes room height issues with the design. Because the length of the cryocooler is substantial, when removing the cryocooler for maintenance (e.g., changeout) from its berth the length of the cryocooler must be added to the ceiling height above the MRI system to allow for servicing removal. As a result, the ceiling height is significantly higher for MRI systems having cryocoolers in the vertical, or near-vertical orientation.

Accordingly, there is an ongoing need for improving the overall design of superconducting magnet assemblies including the areas of maintenance and/or cooling.

BRIEF DESCRIPTION

The present invention overcomes at least some of the aforementioned drawbacks by providing a superconducting magnet assembly, and a method of manufacturing a superconducting magnet assembly, that includes the reduction of the amount of cryogen needed for cooling the superconducting magnet. More specifically, an embodiment of the present invention is directed to providing a superconducting magnet assembly that employs two-phase heat transfer devices (e.g., pulsating heat tubes) for cooling which allow the location of the cryocooler to be divorced from the configuration and location of the superconducting magnet assembly, thereby simplifying the overall design, installation, operation and maintenance of the system.

Therefore, in accordance with one aspect of the invention, a method of manufacturing a superconducting magnet assembly includes providing a housing configured about a first vacuum reservoir; forming a coil former; surrounding the coil former with a thermal shield; locating the thermal shield in the first vacuum reservoir; positioning a superconducting magnet about the coil former, wherein the superconducting magnet is configured about a central core to receive an object; providing a second vacuum reservoir having a cryogen reservoir therein; providing a first two-phase heat transfer device and a second two-phase heat transfer device, each comprising tubing having an evaporator region and a condenser region; thermally connecting the evaporator region of the first two-phase heat transfer device with one of the coil former and the superconducting magnet and the evaporator region of the second two-phase heat transfer device with the thermal shield; and thermally connecting a cryocooler to the cryogen reservoir and to the condensing region of the first and the second two-phase heat transfer devices.

In accordance with another aspect of the invention, a superconducting magnet assembly includes a housing containing a first vacuum reservoir therein, the housing further containing a coil former therein; a plurality of magnets located within or adjacent to the coil former about a central core configure to receive an object; a second vacuum reservoir having a cryogen reservoir therein; a two-phase cryocooler in the second vacuum reservoir and in thermal communication with the cryogen reservoir; and a two-phase heat transfer device comprising: tubing containing liquid and vapor cryogen therein, the tubing including an evaporator region and a condenser region; wherein the evaporator region of the two-phase heat transfer device is in thermal communication with one of the coil former and the plurality of magnets and the condenser region of the two-phase heat transfer device is in thermal communication with the cryogen reservoir.

Various other features and advantages of the present invention will be made apparent from the following detailed description and the drawings.

BRIEF DESCRIPTION OF THE DRAWINGS

The drawings illustrate one embodiment presently contemplated for carrying out the invention.

DETAILED DESCRIPTION

Aspects of the present invention have been shown to offer advantages over previous methodologies of cooling superconducting magnets. The apparatus and method require no mechanical moving parts (e.g., no pumps, no external pressure fed supply system, no refrigeration "coldbox" for cryogen supply, no helium can-fed flow, etc.) in cooling the superconducting magnet. The cooling method is orientation-independent, which aids in the design and ultimate physical volume and footprint of the superconducting magnet assembly. Design integration of tubing into the existing superconducting magnet geometry is simplified. Further, hot spots that may arise can be cured by the pulsating slug flow provided by the pulsating heat pipe(s) employed under aspects of the present invention. The design offers other advantages in that it does not require costly helium bath cooling, nor is any cryogen lost during a quench. The proposed capillary tubing can withstand high pressures of several 100 bars. As a result, no helium reservoir is required. The absence of a helium reservoir and its cryogenic housing is a major simplification in that all safety aspects that need to be adhered to are greatly reduced. Further, the heat loads to the magnet are greatly reduced and minimized due to the absence of the traditional vertical neck or penetration geometry, typical for a standard helium vessel. Access ports and/or penetrations are known to be sources of high heat leaks to a magnet. A desirable result of the improved design is that the usable room temperature bore width of the magnet can be increased. Furthermore, the suspension system required to keep the helium vessel floating in the vacuum vessel is further simplified and the heat leak reduced. Aspects of the present invention provide other advantages with regards to the cryocooler. The cryocooler design and configuration may be greatly simplified in that the cryocooler may be remotely located and/or positioned. As a result, acoustic noise is greatly reduced or removed due the new location of the cryocooler. Magnetic shielding on the cryocooler and around the cryocooler drive is no longer required. Cryocooler lifetime is enhanced because vertical orientation is now more easily obtained. Service of the cryocooler is easier because the cryocooler may be placed at floor level. Additionally, the MRI system can be installed in rooms with lower ceiling heights. Ultimately, the cooling system of the superconducting magnet system and its maintenance is greatly simplified and yet improved.

Figure 1:
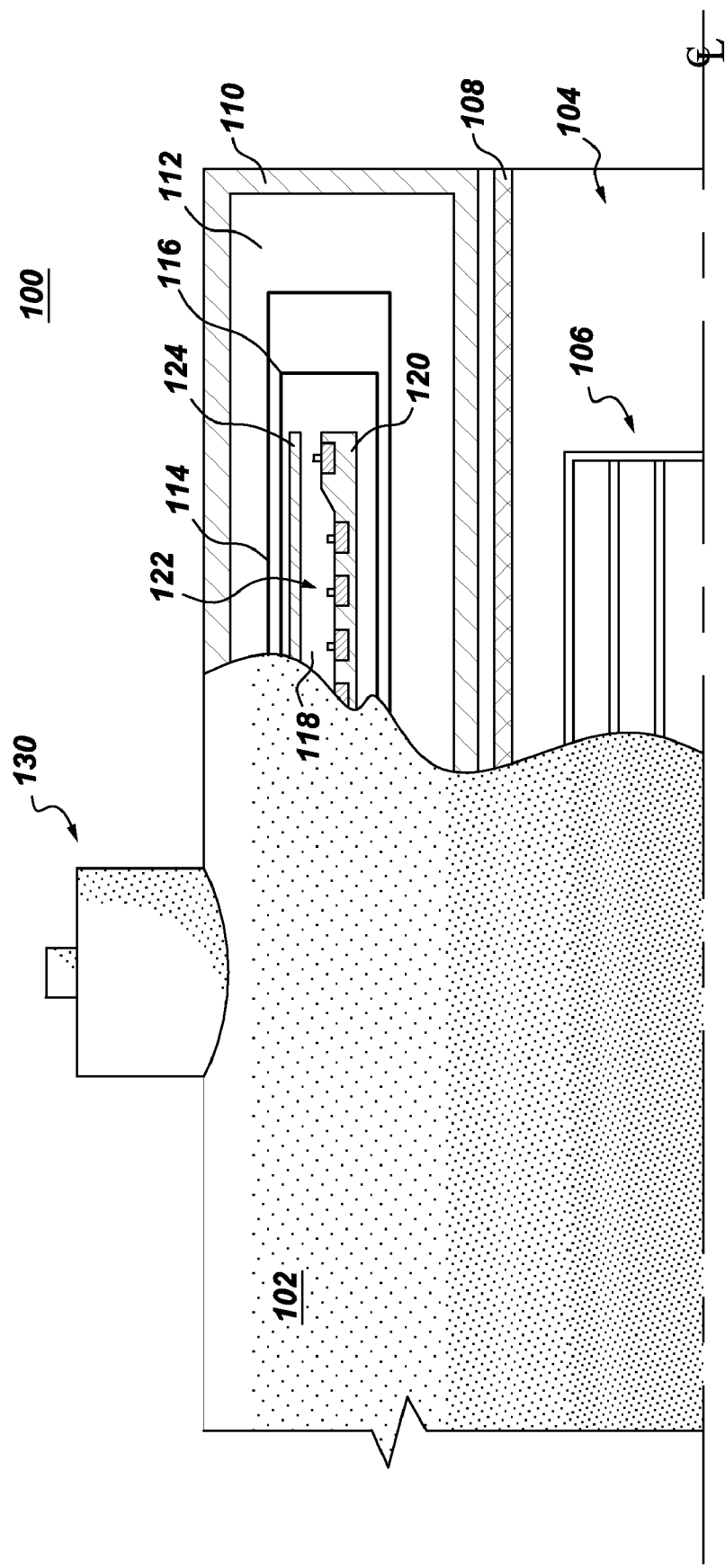
FIG. 1 is a partial cut-away elevation view of a magnetic resonance imaging (MRI) assembly of the related art.
Figure 2:
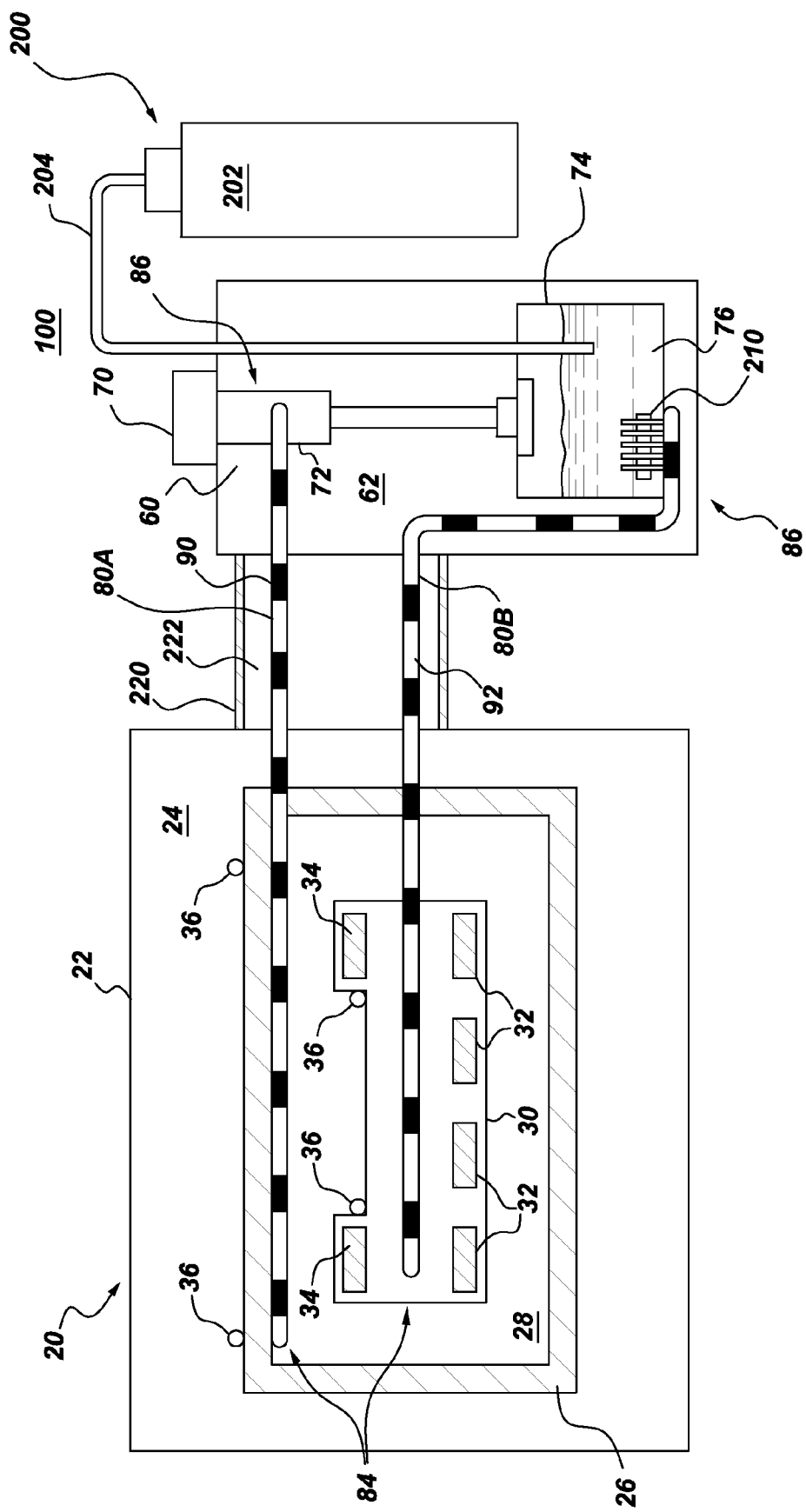
FIG. 2 is a cut-away view of a superconducting magnet assembly and cooling system according to an embodiment of the present invention.

Referring to FIG. 2, a superconducting magnet system 10 according to an embodiment of the present invention is shown. The system 10 includes a superconducting magnet assembly 20 having a first vacuum reservoir 24 and a second vacuum reservoir 62. A housing 22 or outer vacuum case defines the first vacuum reservoir 24. Within the first vacuum reservoir 24 is a thermal shield 26. The thermal shield 26 further defines a vacuum space 28 wherein a coiler former 30 is positioned so as to be surrounded by the thermal shield 26. The coil former 30 has a plurality of magnets 32, 34 embedded therein and/or attached thereto. The magnets 32, 34 ultimately are configured about a central core so as to receive an object (e.g., patient for MRI system). In this manner a superconducting magnet assembly 20 according to an embodiment of the present invention is configured.

The coil former 30 may be made of any suitable thermally conductive material that allows for the superconducting magnets 32, 34 to reach approximately 4 degrees Kelvin. The coil former 30 may be made of any suitable material, such as glass fiber reinforced plastic, composite material, metal (e.g., stainless steel, aluminum, magnesium, etc.), ceramics, or combinations thereof. Embodiments of the present invention are configured such that the coil former 30 is not required to have electrically conductive materials (e.g., copper braiding, etc.) embedded therein. As a result, degradation of the coil former 30 (e.g., thermal cracking, etc.) due to the addition of some of these electrically conductive materials is mitigated and/or avoided. Further as a result, aspects of the design do not require as large a thermally conductive gradient across the coil former 30 as with prior designs.

The vacuum envelope 60 that defines the second vacuum reservoir 62 includes a cryogen reservoir 74 therein. The cryogen reservoir 74 holds a cryogen 76. A cryocooler 70 is located within a sleeve 72 in the envelope 60 so that a portion of the cryocooler 70 is thermally connected to the cryogen reservoir 74. The cryocooler 70 may be removably connected to the sleeve 72 to aid in maintenance (e.g., removal, coldhead exchange, etc.). The cryocooler 70 may be any suitable cryocooler 70 or cooling mechanism. The cryogen 76 may include any suitable cryogen including, for example, helium 4, helium 3, hydrogen, neon, nitrogen, oxygen, argon, krypton, and combinations thereof. The cryogen reservoir 74 may contain a finned-type heat exchanger 210 that aids in the cooling of the cryogen 76 and the two-phase heat transfer device 80 as discussed herein.

Figure 3:
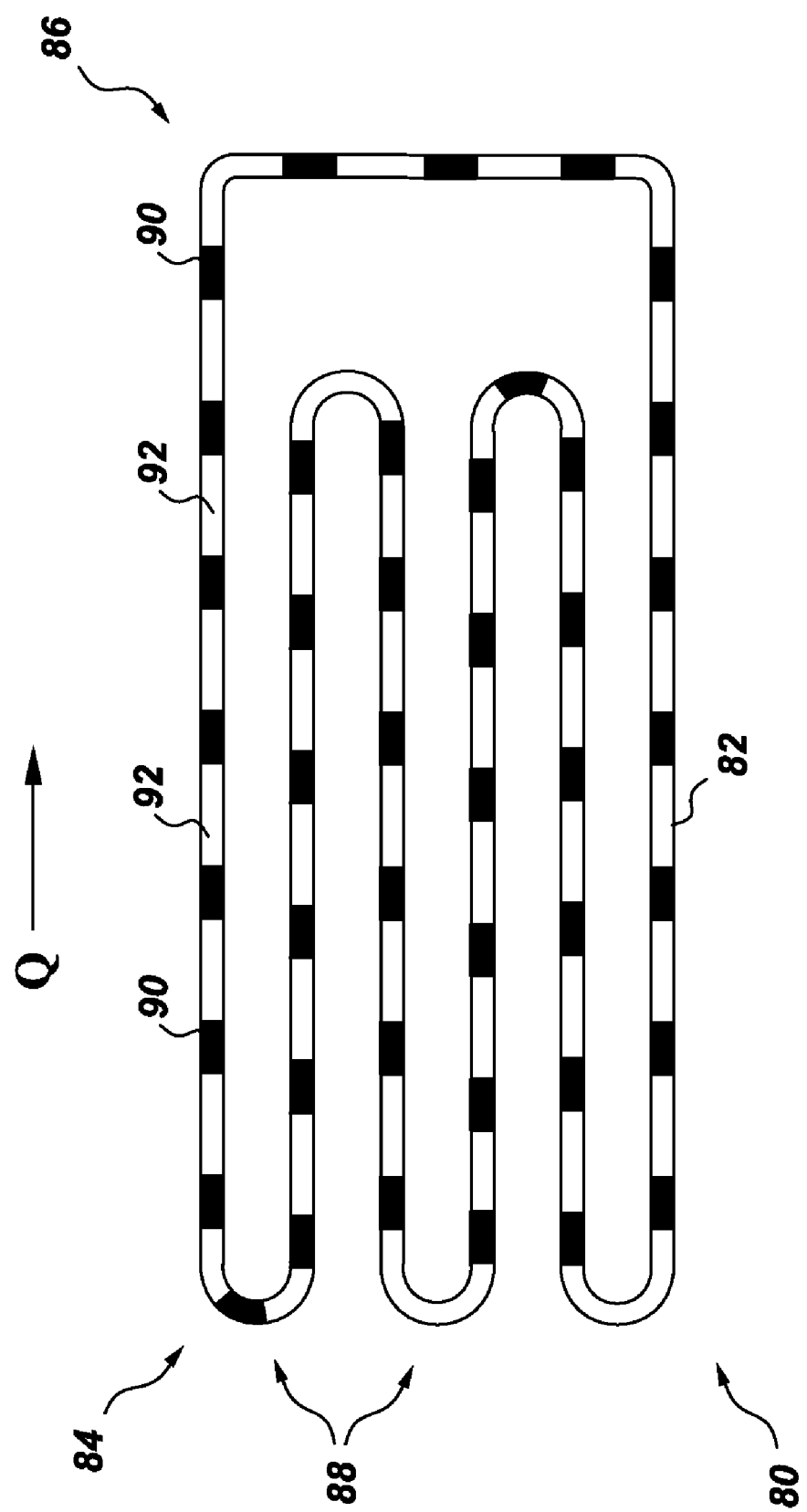
FIG. 3 is a cut-away view of a pulsating heat pipe according to an embodiment of the present invention.

Additionally referring to FIG. 3, cooling of the magnets 32, 34 is in part provided by the use of two, or more, two-phase heat transfer devices 80. The heat transfer devices 80, which may be pulsating heat pipes, include tubing 82 and an evaporative region or portion 84 and a condenser region or portion 86. As shown in FIG. 2 a first two-phase heat pipe 80A is positioned to as to thermally connect its evaporative region 84 with the thermal shield 26 and thermally connect its condenser region 84 with the cryocooler 70 located at the second vacuum region 62. Similarly, the second two-phase heat pipe 80B is positioned so as to thermally connect its evaporative region 84 to one of the coiler former 30 and the magnets 32, 34 and thermally connect its condenser region 86 with cryogen reservoir 74.

A cryogen supply system 200 comprising a cryogen container 202 and a fill tube 204 is connected to the cryogen reservoir 74. The cryocooler 70 liquefies the incoming cryogen gas from the cryogen container 202 in the reservoir 74. In this manner, a suitable cryogen 76 liquid level may be adequately maintained in the reservoir 74, for example during cooldown. The condenser region 86 of the second two-phase heat pipe 80B may be positioned in and/or adjacent to the heat exchanger 210 in the reservoir 74. Alternatively, the condenser region 86 of the second two-phase heat pipe 80B may be positioned below and/or adjacent to the outside of the reservoir 74. In any event, the cryogen 90, 92 contained in the two-phase heat pipes 80 is cooled to approximately 4 degrees Kelvin. Further, the evaporative region 84 of the first two-phase heat transfer device 80A may cool an interior surface of the thermal shield 26 to a range from approximately 40 to approximately 70 Kelvin and the evaporative region 84 of the second two-phase heat transfer device 80B may cool the coil former 30 to approximately 4 Kelvin.

A liquid cryogen 90 and vapor cryogen 92 are placed in the tubing 82. In order to provide adequate thermal cooling to the magnets 32, 34 certain percentages of liquid cryogen 90 and vapor cryogen 92 are placed in the tubing 82. In order for an effective pulsating heat pipe 80 to operate the liquid cryogen 90 can fill a percentage of the total volume of tubing 82 in a range from about 10% to about 90%. Contrastingly, the vapor cryogen 92 would fill a percentage of the total volume of tubing 82 that would be the balance of the total volume of tubing 82 (i.e., in a range from about 90% to about 10%). Any suitable cryogen 90, 92 may be used in the tubing 82 including one of helium 4, helium 3, hydrogen, neon, nitrogen, oxygen, argon, krypton, and combinations thereof. In this manner the pulsating-type movement of the liquid cryogen 90 (i.e., liquid 'slugs') and the vapor cryogen 92 (i.e., 'bubbles') provides excellent cooling of the magnets 32, 34 and the thermal shield. The first two-phase heat transfer device 80A is able to cool an interior surface of the thermal shield 26 to about 50 Kelvin. The second two-phase heat transfer device 80B is able to cool the coil former 30 and/or magnets 32, 34 to about 4 Kelvin.

The pulsating heat pipe 80 (e.g., tubing 82) is partially filled with a liquid cryogen by first cooling the magnet close to the thermal shield temperature. The tubing 82 is then charged with high-pressure gas from room temperature. The cryocooler 70 indirectly liquefies the gas entering the tubing 82 thereby reducing the gas pressure significantly in the tubing 82 and producing droplets of cryogens. In order for the tubing 82 and other system components to act as a pulsating heat pipe 80, less than the entirety of the tubing 82 volume may be filled with the cryogen. Thus, while a portion of the tubing 82 volume is filled with the liquid cryogen 90, the remaining portion has still vapor cryogen (e.g., cryogen bubbles 92) therein. The liquid cryogen may comprise one of helium 4, helium 3, hydrogen, neon, nitrogen, oxygen, argon, krypton, and combinations thereof. Other suitable cryogens may be used in other embodiments depending on the type of superconductor used for the magnet. Alternatively, the tubing 82 may be pre-charged under high-pressure gas.

It has been discovered that various mixtures of liquid 90 and vapor 92 cryogen within the tubing 82 portion of the pulsating heat pipe 80 work in dissipating heat generated from the superconducting magnet assembly 20. For example, in certain embodiments the ratio of liquid cryogen to the total volume of the tubing 82 can be in a range from about 10% to about 90%. Similarly, in other embodiments the ratio of liquid cryogen to the total volume of the tubing 82 can be in a range from about 30% to about 70%. The balance of the total volume of tubing 82 (i.e., portion not filled with liquid cryogen) is filled with vapor cryogen (e.g., cryogen bubbles 92). Thus, vapor cryogen may fill a percentage of the total volume of tubing 82 in a range from about 90% to about 10%. In other embodiments the ratio of vapor cryogen to the total volume of tubing 82 can be in a range from about 70% to about 30%. In this manner a mixture of liquid cryogen and vapor cryogen work to cool the superconducting magnet assembly 20.

While the tubing 82 in FIGS. 2 and 3 is shown in a serpentine, closed system pattern, the tubing 82 in embodiments of the present invention can be arranged in a variety of configurations. The tubing 82 may be arranged in a closed loop or an open loop system. Closed loop, or closed system, is defined as tubing 82 that connects with itself (e.g., end-to-end). Open loop, or an open system, is defined as tubing 82 that does not connect with itself. The tubing 82 may be any quantity of individual tubes 82 (i.e., capillaries) ranging from a single tube 82 to a near infinite quantity of separate tubes 82. With embodiments with multiple tubes 82, all the tubes 82 may be closed, or all open, or a combination of the two. The geometry of each tube 82 may also vary from a straight tube 82 extending from the evaporator region 84 to condenser region 86; to tubing 82 with a plurality of turns 88 therein. The tubing 82 may be arranged in an organized, serpentine, and horizontal (or slightly inclined) pattern (See e.g., FIG. 3). Contrastingly, the tubing 82 may be arranged in a non-repeating, asymmetric, and/or non-planar arrangement while still providing adequate cooling means of the superconducting magnet assembly 20. An advantage of aspects of the present invention is that the geometry and arrangement of the tubing 82 may be entirely independent of gravity and orientation. In other words, gravity and the orientation of the pulsating heat pipe 80 and tubing 82 is not known to substantially affect the flow and the cooling performance of the liquid and vapor cryogen in the pulsating heat pipe 80. The tubing 82 may, for example, be substantially horizontal, substantially vertical, or combinations thereof. In any event, the tubing 82 geometry may be adapted and arranged to fit and match with the coil former 30 or other elements of the superconducting magnet assembly 20 to which the tubing 82 is thermally connected. This allows for increased flexibility of the manufacturing size and arrangement of the entire superconducting magnet assembly 20 in that the cooling mechanism would not typically require additional and/or significant design space.

The total volume of all tubing 82 for the pulsating heat pipe 80 may be in a range of approximately 10 ml to approximately 2 liters depending on the superconducting magnet assembly 20 size and application. The tubing 82 may be made of any suitable material such as copper and its alloys, aluminum and its alloys, stainless steel, and the like. Alternatively, the tubing 82 may be an internally clad capillary or formed tubing 82. The inside diameter of the tubing 82 may be in a range of approximately 1 mm to approximately 8 mm. Similarly, the diameter of the tubing 82 need not be uniform over the entire length of the tubing 82 but may vary over its length. For example, the diameter of the tubing 82 in the condensing portion may be narrower than in other portions of the pulsating heat pipe 80 in order to slow down flow velocity of the cryogen. Similarly, the cross-section of the tubing 82 may be other shapes, such as square, rectangular, oval-shaped, and the like. Additionally, the cross-sectional shape of the tubing 82 may vary over the length of the tubing 82. Various configurations of an evaporator portion 84 may be employed. The evaporator portion 84 may, as shown in FIG. 2, only require a simple epoxy coil former 30. As a result, there is no need to increase the thermal conductivity of the coil former 30 using fillers used in prior art designs. While considerable efforts have been extended in the past to develop epoxy materials, composites, and the like, with high-thermal conductivity fillers they have only been met with limited success to increase the heat spreading performance of the coil former. While all of these approaches add cost to the system more importantly they increase the risk of inducing stress on the coil former. The coil former can crack, and the crack(s) can further propagate upon rapid cooling down or warming up of the magnet. It is not unheard of for superconducting magnets to fail due to epoxy cracking. Under aspects of the present invention, the need for any heat spreading mechanism is avoided.

In an embodiment a pre-cooling loop 36 or other suitable pre-cool piping system is thermally connected to the coil former 30 so as to aid in providing, for example, nitrogen pre-cool during startup. In another embodiment an additional pre-cooling loop 36 may be thermally connected to the thermal shield 26. The pre-cooling loop(s) 36 may be supplied with cryogen via a dewar (not shown) or other suitable means. The pre-cooling loop may be cooled via nitrogen, neon, hydrogen, or any other suitable cryogen or mixture of cryogens.

In another embodiment there may be no thermal shield 26. Additionally, the assembly may include only a single two-phase heat transfer device similar to the two-phase heat transfer device labeled 80B above. In this embodiment, the two-phase heat transfer device configured at and/or near the thermal shield 26 is omitted.

The first vacuum reservoir 24 and the second vacuum reservoir 62 may be a single contiguous, shared vacuum region. Alternatively, the first vacuum reservoir 24 and the second vacuum reservoir 62 may be substantially separated as shown in FIG. 2. For example, the second vacuum reservoir 62 may be advantageously located several feet distant from the first vacuum reservoir 24. In embodiments, the second vacuum reservoir 62 may be entirely remote from the first vacuum reservoir 24. This configuration may aid in the removal of the cryocooler 70 from the system 10 without potentially deleterious impacts to the magnets 32, 34 as discussed herein. Still alternatively, the first vacuum reservoir 24 and the second vacuum reservoir 62 may be separate vacuum reservoirs but located in immediate adjacency to each other.

As shown, in FIG. 2, portions of the two-phase heat transfer devices 80A, 80B may be encased in a vacuum tube 220 having a vacuum 222 therein, thereby aided in the cooling of the cryogen 90, 92 therein. The vacuum tube 220 may extend along portions of the two-phase heat transfer devices 80A, 80B that are exterior to the first vacuum reservoir 24 and the second vacuum reservoir 62. Alternatively, the vacuum tube 220 may extend along any and/or all portions of either, or both, of the two-phase heat transfer devices 80A, 80B.

An embodiment of a method of cooling a superconducting magnet assembly 20 includes first evacuating the tubing 82 and then partially filled with a cryogen under high pressure as discussed herein. Partially filling comprises filling in a range from about 10% to about 90% of the total volume of the tubing 82 with a liquid cryogen 90. The remaining volume of the tubing 82 may comprise vapor cryogen (i.e., bubbles 92). In this manner, the working fluid (i.e., cryogen) naturally distributes over the length of tubing 82 into distinct liquid plugs 90 and vapor bubbles 92. In this manner various tube sections of the tubing 82 in the pulsating heat pipe 80 have different volumetric fluid/vapor distribution. As the pulsating heat pipe 80 operates, each tubing 82 section at the evaporator portion 84 is heated by virtue of its adjacency to the superconducting magnet assembly 20. Similarly, each tubing 82 section at the condenser portion 86 is cooled. As a result, vapor cryogen bubbles 92 are generated and/or grow in the evaporator region and collapse and/or shrink in the condenser portion 86. This change in vapor bubble 92 size concomitantly causes liquid cryogen 90 transport due to the bubble pumping action, ultimately resulting in sensible heat transfer within the pulsating heat pipe 80. Thermally induced self-excited oscillations commence.

The cooling apparatus 10 may be designed in accordance with aspects of the present invention so that the vapor bubbles 92 have an opportunity to lose their entire latent heat in the condenser portion 86 thereby collapsing in size. This requires that the residence time of the vapor bubble 92 in the condenser portion 86 should be sufficient for complete condensation of the vapor bubble 92. Each vapor bubble 92 carries a relatively small amount of enthalpy, more and more vapor bubbles 92 should get an opportunity to loose their latent heat in the condenser portion 86 so that their integrated effect exceeds the frictional disadvantages that may be caused by their presence in the tubing 82. There should be enough liquid plugs 90 in the pulsating heat pipe 80 for substantial sensible heat transfer.

While exemplary embodiments of the present invention are able to cool superconducting magnet assemblies to around 4.2 Kelvin for superconducting operation, other operating temperatures besides 4.2 Kelvin may be employed without departing from the scope of the invention. For example, superconductors with higher transition temperatures (e.g., of HTS type or MgB2-type) can be cooled under aspects of the present invention.

While the embodiments illustrated and described herein were shown used with a superconducting magnet assembly 10 that is part of a magnetic resonance imaging (MRI) system, other superconducting magnet systems may employ aspects of the present invention without departing from the scope of the invention. For example, the cooling apparatus and method of cooling may be used with other superconducting magnets such as nuclear magnetic resonance spectroscopy systems, magnetic energy storage systems, superconducting generators, superconducting fault current limiters, superconducting particle accelerators, magnetic separation systems, transportation systems, superconducting cables, transformers, superconducting supercomputers, space and aeronautics applications, and the like.

Therefore, according to one embodiment of the present invention, a method of manufacturing a superconducting magnet assembly includes providing a housing configured about a first vacuum reservoir; forming a coil former; surrounding the coil former with a thermal shield; locating the thermal shield in the first vacuum reservoir; positioning a superconducting magnet about the coil former, wherein the superconducting magnet is configured about a central core to receive an object; providing a second vacuum reservoir having a cryogen reservoir therein; providing a first two-phase heat transfer device and a second two-phase heat transfer device, each comprising tubing having an evaporator region and a condenser region; thermally connecting the evaporator region of the first two-phase heat transfer device with one of the coil former and the superconducting magnet and the evaporator region of the second two-phase heat transfer device with the thermal shield; and thermally connecting a cryocooler to the cryogen reservoir and to the condensing region of the first and the second two-phase heat transfer devices.

According to another embodiment of the present invention, a superconducting magnet assembly includes a housing containing a first vacuum reservoir therein, the housing further containing a coil former therein; a plurality of magnets located within or adjacent to the coil former about a central core configure to receive an object; a second vacuum reservoir having a cryogen reservoir therein; a two-phase cryocooler in the second vacuum reservoir and in thermal communication with the cryogen reservoir; and a two-phase heat transfer device comprising: tubing containing liquid and vapor cryogen therein, the tubing including an evaporator region and a condenser region; wherein the evaporator region of the two-phase heat transfer device is in thermal communication with one of the coil former and the plurality of magnets and the condenser region of the two-phase heat transfer device is in thermal communication with the cryogen reservoir.

The present invention has been described in terms of the preferred embodiment, and it is recognized that equivalents, alternatives, and modifications, aside from those expressly stated, are possible and within the scope of the appending claims.

What is claimed is:

1. A method of manufacturing a superconducting magnet assembly comprising:
   providing a housing configured about a first vacuum reservoir;
   forming a coil former;
   surrounding the coil former with a thermal shield;
   locating the thermal shield in the first vacuum reservoir;
   positioning a superconducting magnet about the coil former, wherein the superconducting magnet is configured about a central core to receive an object;
   providing a second vacuum reservoir having a cryogen reservoir therein;
   providing a first two-phase heat transfer device and a second two-phase heat transfer device, each comprising tubing having an evaporator region and a condenser region;
   thermally connecting the evaporator region of the first two-phase heat transfer device with one of the coil former and the superconducting magnet and the evaporator region of the second two-phase heat transfer device with the thermal shield; and
   thermally connecting a cryocooler to the cryogen reservoir and to the condensing region of the first and the second two-phase heat transfer devices.

2. The method of claim 1, further comprising:
   adding a liquid and a vapor cryogen to the tubing.

3. The method of claim 2, wherein the liquid and the vapor cryogen comprises one of helium 4, helium 3, hydrogen, neon, nitrogen, oxygen, argon, krypton, and combinations thereof.

4. The method of claim 2 wherein the liquid cryogen fills a percentage of a total volume of the tubing in a range from about 10% to about 90%.

5. The method of claim 1 wherein the first and the second two-phase heat transfer device comprise pulsating heat pipes.

6. The method of claim 1, wherein the tubing is a closed system.

7. The method of claim 1, wherein the superconducting magnet assembly is configured for use as one of a nuclear magnetic resonance spectroscopy system, a magnetic energy storage system, a superconducting generators, a superconducting fault current limiter, a superconducting particle accelerator, a magnetic separation system, a transportation systems, a superconducting cable, a transformer, and a superconducting supercomputer.

8. The method of claim 1, wherein the tubing is an open system.

9. The method of claim 1, wherein the first vacuum reservoir and the second vacuum reservoir are substantially separate.

10. The method of claim 1, wherein the tubing comprises a plurality of tubing.

11. A superconducting magnet assembly comprising:
    a housing containing a first vacuum reservoir therein, the housing further containing:
      a coil former therein;
      a plurality of magnets located within or adjacent to the coil former about a central core configure to receive an object;
    a second vacuum reservoir having a cryogen reservoir therein;
    a cryocooler in the second vacuum reservoir and in thermal communication with the cryogen reservoir; and
    a two-phase heat transfer device comprising:
      tubing containing liquid and vapor cryogen therein, the tubing including an evaporator region and a condenser region;
    wherein the evaporator region of the two-phase heat transfer device is in thermal communication with one of the coil former and the plurality of magnets and the condenser region of the two-phase heat transfer device is in thermal communication with the cryogen reservoir.

12. The superconducting magnet assembly of claim 11, wherein the two-phase heat transfer devices comprises a pulsating heat pipe.

13. The superconducting magnet assembly of claim 11, further comprising a nitrogen pre-cool piping system in thermal communication with one of the plurality of magnets and the coil former.

14. The superconducting magnet assembly of claim 11 wherein the liquid and vapor cryogen in the tubing of the first and second two-phase heat exchangers comprises one of helium 4, helium 3, hydrogen, neon, nitrogen, oxygen, argon, krypton, and combinations thereof.

15. The superconducting magnet assembly of claim 11 wherein the liquid cryogen fills a percentage of a total volume of the tubing of the two-phase heat transfer devices in a range from about 10% to about 90%.

16. The superconducting magnet assembly of claim 11, wherein the first vacuum reservoir is substantially separate from the second vacuum reservoir.

17. The superconducting magnet assembly of claim 11, wherein the first vacuum reservoir and the second vacuum reservoir are a contiguous vacuum reservoir.

18. The superconducting magnet assembly of claim 11, wherein the two-phase heat transfer device comprises a plurality of tubing.

19. The superconducting magnet assembly of claim 11 wherein the tubing of the two-phase heat transfer devices is a closed system.

20. The superconducting magnet assembly of claim 11 wherein the tubing of one of the two-phase heat transfer devices is an open system.

21. The superconducting magnet assembly of claim 11 wherein the tubing is configured in a serpentine pattern.

22. The superconducting magnet assembly of claim 11, wherein the tubing is embedded in the coil former.

23. The superconducting magnet assembly of claim 11, wherein a flow geometry of the tubing is one of substantially horizontal, substantially vertical, and combinations thereof.

24. The superconducting magnet assembly of claim 11, wherein the evaporative region of the two-phase heat transfer device cools the coil former to approximately 4 Kelvin.

25. The superconducting magnet assembly of claim 11, wherein the assembly comprises a magnetic resonance imaging (MRI) system.

26. The superconducting magnet assembly of claim 11, further comprising a thermal shield of the first vacuum reservoir defining a volume, the thermal shield containing the coil former.

27. The superconducting magnet assembly of claim 26, further comprising a second two-phase heat transfer device comprising tubing containing liquid and vapor cryogen therein, the tubing including an evaporator region and a condenser region, wherein the evaporator region of the second two-phase heat transfer device is in thermal communication with the thermal shield and the condenser region of the second two-phase heat transfer device is in thermal communication with the cryocooler.

28. The superconducting magnet assembly of claim 27, wherein the evaporative region of the second two-phase heat transfer device cools an interior surface of the thermal shield to a range of approximately 40 Kelvin to approximately 70 Kelvin.

\* \* \* \* \*